United States Patent [19]

Tero

[11] Patent Number: 4,977,378

[45] Date of Patent: Dec. 11, 1990

[54] RAPID-RESPONSE DIFFERENTIAL AMPLIFIER WITH RAIL-TO-RAIL INPUT CAPABILITY

[75] Inventor: John P. Tero, Saratoga, Calif.

[73] Assignee: North American Philips Corp., Sunnyvale, Calif.

[21] Appl. No.: 405,485

[22] Filed: Sep. 8, 1989

[51] Int. Cl.⁵ .............................................. H03F 3/45
[52] U.S. Cl. ..................................... 330/258; 330/252
[58] Field of Search ................. 330/252, 253, 254, 258

[56] References Cited

U.S. PATENT DOCUMENTS 4,555,673 11/1985 Huijsing et al. ...................... 330/258
4,864,248 9/1989 Jansen ................................... 330/254

Primary Examiner—James B. Mullins
Attorney, Agent, or Firm—T. Briody; A. Tamoshunas; R. Meetin

[57] ABSTRACT

A differential amplifier contains first and second differential portions (20 and 22) that operate together to achieve rail-to-rail input amplification capability. A main current supply (6) provides a main supply conduit ($I_L$) for the two differential portions. The circuit transconductance is controlled in a desired manner with a control amplifier (AN) suitably coupled to the differential portions and main current supply. A current-steering circuit typically formed with a pair of voltage clamps (30 and 32) enables a pair of level-shift current supplies (16 and 18) in the second differential portion to remain conductive as the input common-mode voltage traverses the entire supply voltage range. Consequently, the differential amplifier achieves a very fast response to changes in the input voltage difference irrespective of the value of the input commond-mode voltage.

18 Claims, 3 Drawing Sheets

RAPID-RESPONSE DIFFERENTIAL AMPLIFIER WITH RAIL-TO-RAIL INPUT CAPABILITY

FIELD OF USE

This invention relates to differential amplifiers that can be made in semiconductor integrated circuit form and, more specifically, to a differential amplifier formed with a pair of parallel differential portions that work as a unit to achieve rail-to-rail input capability.

BACKGROUND ART

A differential amplifier formed as part of an integrated circuit often utilizes a low power supply voltage in amplifying a differential input signal. This severely constrains the voltage range of the common-mode portion of the input signal. Consequently, it is desirable that the amplifier have rail-to-rail input capability. That is, the amplified output signal should be representative of the input signal as its common-mode voltage travels the full range of the power supply voltage.

U.S. Pat. No. 4,555,673 describes several embodiments of a differential amplifier that uses complementary pairs of input transistors to attain rail-to-rail input capability. Referring to the drawings, FIG. 1 illustrates one of the bipolar embodiments disclosed in U.S. Pat. No. 4,555,673. This device amplifies an input signal differentially supplied between input terminals $T_{I1}$ and $T_{I2}$ as input voltages $V_{I1}$ and $V_{I2}$. The common-mode voltage $V_{CM}$ of the input signal is $(V_{I1}+V_{I2})/2$.

The device in FIG. 1 is connected between a source of a high supply voltage $V_{HH}$ (the high rail) and a source of a low supply voltage $V_{LL}$ (the low rail). The voltage difference $V_{HH}$- $V_{LL}$ is the overall power supply voltage VPS for the amplifier. VPS is somewhat greater than $2V_{BE}$, where $V_{BE}$ is the absolute value of the standard voltage across the base-emitter junction of a bipolar transistor when it is just turned on. $V_{BE}$ is about 0.6–0.8 volt.

The amplifier contains a main current source 6 connected between a supply point P1 and the $V_{LL}$ supply. Current source 6 provides a main supply current $I_L$ for a pair of differential amplifying portions 8 and 10. The circuit in FIG. 1 largely divides current $I_L$ into operating currents $I_{P1}$ and $I_{P2}$.

Differential portion 8 consists of NPN input transistors Q1 and Q2 that enable the amplifier to perform signal amplification up to the high rail. Voltages $V_{I1}$ and $V_{I2}$ are provided to the bases of transistors Q1 and Q2. Their emitters are connected together at point PI to receive operating current IPI When the input common-mode voltage $V_{CM}$ is in a part of the VPS range extending from $V_{HH}$ down to a prescribed voltage greater than $V_{LL}$, transistors Q1 and Q2 amplify the input signal by largely dividing current $I_{P1}$ into intermediate currents $I_A$ and $I_B$ whose difference is representative of the input signal.

Differential portion 10 contains a voltage level-shift circuit 12 that translates the input signal into a shifted differential signal whose common-mode voltage is at least $IV_{BE}$ higher than $V_{CM}$. Level-shift circuit 12 centers around PNP input transistors Q3 and Q4 that enable the amplifier to provide signal amplification down to the low rail. Voltages $V_{I1}$ and $V_{I2}$ are supplied to the bases of transistors Q3 and Q4. Their collectors are tied to the $V_{LL}$ supply.

The emitters of transistors Q3 and Q4 are coupled through level-shift resistors RL1 and RL2 to nodes N1 and N2 at which the shifted differential signal is supplied. The Q3 and Q4 base-emitter junctions provide the $1V_{BE}$ part of the level shift. Resistors RL1 and RL2 augment the level shift beyond $1V_{BE}$ as necessary.

Current sources 16 and 18 provide supply currents $I_{H1}$ and $I_{H2}$ for the level shifting. Current source 16 is connected between node N1 and the $V_{HH}$ supply. Current source 18 is similarly connected between node N2 and the $V_{HH}$ supply.

The actual signal amplification in differential portion 10 is done with an amplifier circuit 14 consisting of NPN transistors Q5 and Q6. The shifted differential signal at nodes N1 and N2 is supplied to the bases of transistors Q5 and Q6. Their emitters are connected together at a supply point P2 to receive operating current $I_{P2}$. When voltage $V_{CM}$ is in a part of the $V_{PS}$ range extending from $V_{LL}$ up to a prescribed voltage less than $V_{HH}$, transistors Q5 and Q6 amplify the differential input signal (in its level-shifted form) by largely dividing current $I_{P2}$ into intermediate currents IC and ID whose difference is representative of the input signal.

The Q1 and Q5 collectors are connected together to provide an output current $I_{01}$ at an output terminal $T_{01}$. Likewise, the Q2 and Q6 collectors are connected together to provide a complementary output current $I_{02}$ at another output terminal $T_{02}$.

The final component of the amplifier is an NPN control transistor QN whose emitter and collector are respectively connected to points P1 and P2. In response to a control voltage $V_{RN}$ supplied to its base, transistor QN regulates the values of currents $I_{P1}$ and $I_{P2}$ as a function of $V_{CM}$. Control voltage $V_{RN}$ lies in a range extending from $V_{LL}+V_{SM}+V_{BE}$ to $V_{HH}-V_{SM}-V_{BE}$. $V_{SM}$ is a small safety-margin voltage typically about 0.2–0.3 volt.

FIG. 2 illustrates an idealized graph useful in understanding the operation of the circuit in FIG. 1. By choosing voltage $V_{RN}$ in the foregoing way, the parts of the $V_{PS}$ range in which differential portions 8 and 10 provide signal amplification partially overlap. Portions 8 and 10 are both operationally conductive when $V_{CM}$ is in a narrow intermediate sub-range generally centering on $V_{RN}$. In FIG. 2, this sub-range extends from $V_{RN}-VW$ to $V_{RN}+V_W$, where $2V_W$ is the approximate 100-millivolt width of the sub-range.

As $V_{CM}$ is raised from $V_{LL}$ to $V_{HH}$, the differential amplifier first goes through a low sub-range extending from $V_{LL}$ to $V_{RN}-V_W$ in which differential portion 10 provides all 15 of the signal amplification. Transistors Q3–Q6 are turned on. Transistors Q1 and Q2 are turned off so as to make differential portion 8 non-conductive. The amplifier then goes through the intermediate sub-range extending from $V_{RN}-V_W$ to $V_{RN}+V_W$ in which transistor QN progressively steers supply current $I_L$ away from portion 10 and to portion 8. Transistors Q5 and Q6 turn progressively off as transistors Q1 and Q2 turn progressively on.

The differential amplifier finally goes through a high sub-range extending from $V_{RN}+V_W$ to $V_{HH}$ in which portion 8 provides all of the signal amplification. Transistors Q1 and Q2 are turned fully on. Transistors Q5 and Q6 are non-conductive so that portion 10 is thus turned off. If $V_{CM}$ gets sufficiently close to $V_{HH}$, transistors Q3 and Q4 also turn off.

The circuit transconductance—i.e., the ratio of an incremental change in the output current difference $I_{01}-I_{02}$ to an incremental change in the input voltage difference $V_{I1} - V_{I2}$ —is proportional to the sum of currents $I_{P1}$ and $I_{P2}$ in the differential amplifier of FIG. 1. Due to the current steering provided by transistor QN, the sum of $I_{P1}$ and $I_{P2}$ is approximately equal to $I_L$ at any value of $V_{CM}$ in the $V_{PS}$ range. As a result, the transconductance is largely constant. In contrast to the situation in which large changes occur in the transconductance as $V_{CM}$ traverses the $V_{PS}$ range, the constant transconductance of the circuit in FIG. 1 enables an optimum frequency response to be achieved irrespective of the value of $V_{CM}$ when the differential amplifier is used in an operational amplifier with negative feedback.

When $V_{CM}$ rises to a high enough point that transistors Q3 and Q4 turn off, level-shift current sources 16 and 18 go into saturation and/or turn off. Current sources 16 and 18 thereby take a relatively long time to return to their normal non-saturated fully conductive condition when $V_{CM}$ drops down low enough to turn transistors Q3 and Q4 back on. Consequently, the response of the amplifier circuit to changes in the value of input difference $V_{I1} - V_{I2}$ is unduly slow. While the turnoff of transistors Q3 and Q4 is basically unavoidable, it would be highly desirable to prevent current sources 16 and 18 from going into saturation and/or turning off during circuit operation.

GENERAL DISCLOSURE OF THE INVENTION

The present invention is a differential amplifier that uses a current-steering technique to overcome the foregoing problem. The amplifier centers around first and second differential portions that operate together to amplify an input signal differentially supplied between a pair of input terminals. Power for the amplifier is provided from sources of first and second supply voltages whose difference is a power supply voltage that defines a supply voltage range.

The first differential portion, which is coupled to the input terminals, amplifies the differential input signal by dividing a first operating current provided at a first-supply point into a pair of first intermediate currents. The difference between the first intermediate currents is representative of the differential input signal when its common-mode voltage $V_{CM}$ is in a part of the supply range extending to the second supply voltage.

The second differential portion contains a voltage level-shift circuit coupled to the input terminals. The level-shift circuit differentially provides a pair of nodes with a shifted signal whose common-mode voltage is closer to the second supply voltage than is the input common-mode voltage $V_{CM}$. A level-shift current supply is coupled between the second voltage supply and one of the nodes. Another level-shift current supply is coupled between the second voltage supply and the other node.

The second differential portion further includes an amplifier circuit coupled to the nodes for amplifying the input signal (in its level-shifted form) by dividing a second operating current provided at a second supply point into a pair of second intermediate currents. The difference between the second intermediate currents is representative of the differential input signal when $V_{CM}$ is in a part of the supply range extending to the first supply voltage. This part of the supply range overlaps with the first-mentioned part of the supply range. Accordingly, the differential amplifier achieves rail-to-rail input capability.

A main current supply, which is coupled between the first supply point and the first voltage supply, provides a main supply current for both differential portions. A control amplifier having a control electrode that receives a control voltage, a first flow electrode coupled to the first supply point, and a second flow electrode coupled to the second supply point steers the main supply current between the two differential portions. The transconductance of the differential amplifier can thereby be regulated in a desired manner.

Importantly, the differential amplifier contains a current-steering circuit that enables the two level-shift current supplies to remain operationally conductive as $V_{CM}$ traverses the full supply range. When the voltage level-shift circuit turns off, the current-steering circuit opens paths to the first voltage supply for current provided from the level-shift current supplies. This typically entails suitably clamping the voltages at the two nodes. The level-shift current supplies are there by inhibited from going into an undesirable condition, such as saturation or turn-off, when $V_{CM}$ gets close to the second supply voltage. As a result, the present differential amplifier provides a very fast response to changes in the input voltage difference as $V_{CM}$ varies across the full supply range.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 3:
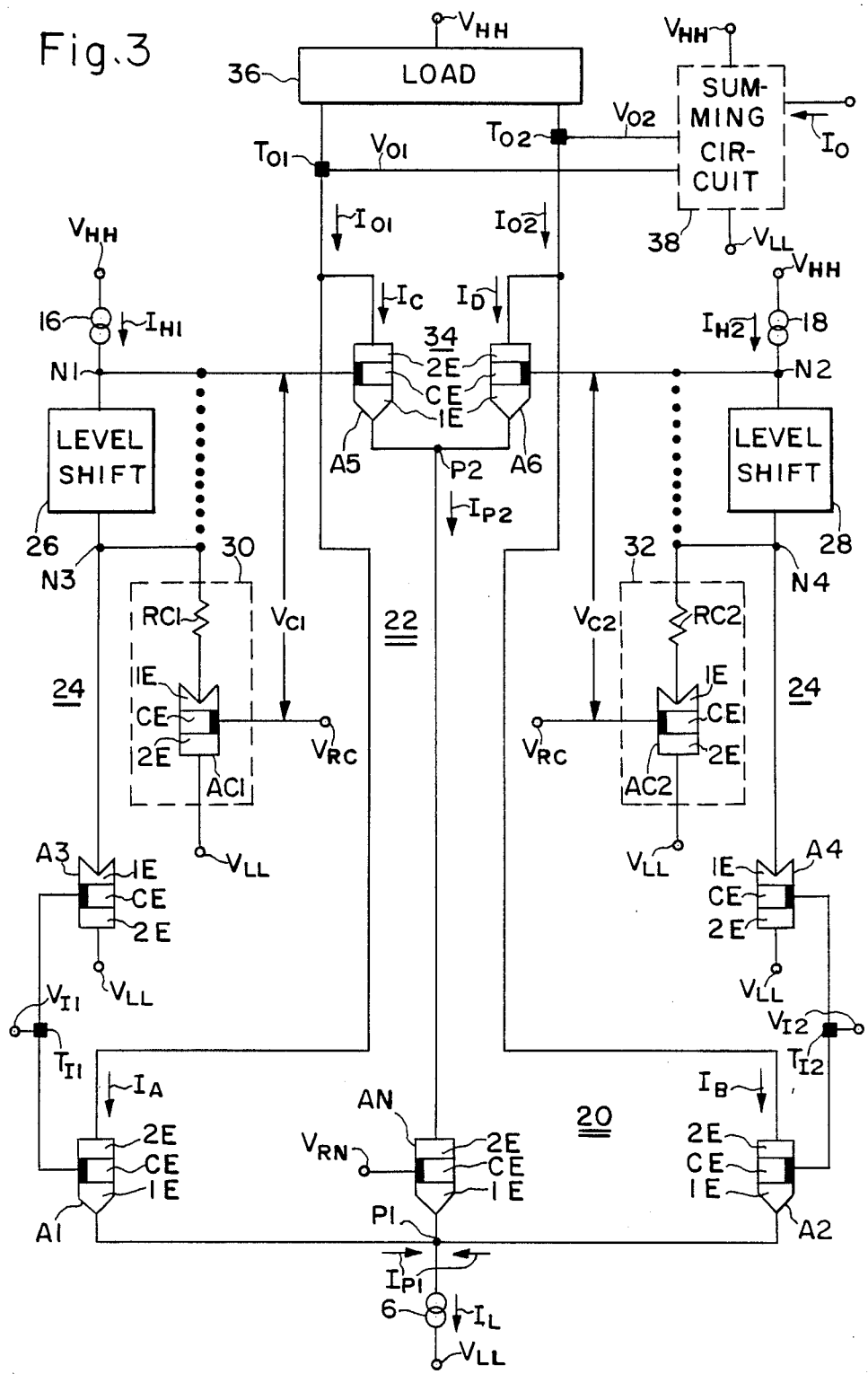
FIG. 3 is a circuit diagram of a general differential amplifier in accordance with the invention.

Referring to FIG. 3, it illustrates a general arrangement for a differential amplifier having rail-to-rail input capability and controlled transconductance. The amplifier employs a current-steering mechanism in accordance with the teachings of the invention to achieve a rapid response irrespective of the value of input common-mode voltage $V_{CM}$ as it varies across the entire $V_{PS}$ range from $V_{LL}$ to $V_{HH}$.

The amplifying device in FIG. 3 uses various three-electrode amplifiers identified by reference symbols beginning with the letter "A". Each "A" amplifier has a first flow electrode (1E), a second flow electrode (2E), and a control electrode (CE) for controlling current flow between the flow electrodes (1E and 2E). Charge carriers, either electrons or holes, that move between the flow electrodes of each "A" amplifier originate at its first flow electrode and terminate at its second flow electrode. Current flow begins when the voltage between the control electrode and the first flow electrode passes a specified threshold level. The current (if any) flowing in the control electrode is much smaller than that otherwise moving between the flow electrodes.

Each "A" amplifier preferably consists of a single transistor. In the case of a bipolar transistor, its emitter, collector, and base are respectively the first, second, and control electrodes. These elements are respectively the source, drain, and gate for a field-effect transistor (FET) of either the insulated-gate or junction type.

In some cases, each "A" amplifier could consist of more than one transistor. One example is a bipolar Darlington circuit in which the emitter of an input transistor is connected to the base of a trailing transistor. In this case, the control electrode of the "A" amplifier is (connected to) the base of the input transistor, while the first and second control electrodes are (connected to) the emitter and collector of the trailing transistor.

As used in describing two (or more) of the "A" amplifiers, "like-configured" means that the amplifiers have corresponding elements interconnected in the same way and that each set of corresponding elements is of the same semiconductor polarity. For example, two of the "A" amplifiers are like-configured if both are NPN transistors but not if one is an NPN transistor while the other is a PNP transistor. Likewise, Darlington circuits are like-configured as long as the input transistors are of the same polarity and the trailing transistors are of the same polarity (even if different from that of the input transistors).

If electrons move between the flow electrodes of one "A" amplifier, while holes move between the flow electrodes of another "A" amplifier, the two amplifiers may be referred to as being "complementary" or "of opposite polarity". Thus, an "A" amplifier formed with a PNP transistor is of opposite polarity to an "A" amplifier formed with an NPN transistor.

The differential amplifier in FIG. 3 centers around differential amplifying portions 20 and 22 that receive main supply current $I_L$ from main current source 6 connected between point P1 and the $V_{LL}$ supply. Differential portions 20 and 22 work together to amplify the input signal formed by the difference between input voltages $V_{I1}$ and $V_{I2}$. Portion 20 is operationally conductive when $V_{CM}$ is in a part of the $V_{PS}$ range extending from $V_{HH}$ down to a prescribed voltage $V_{AL}$ that is somewhat greater than $V_{LL}$. Portion 22 is operationally conductive when $V_{CM}$ is in a part of the $V_{PS}$ range extending from $V_{LL}$ up to another prescribed voltage $V_{AH}$ that is somewhat less than $V_{HH}$. The circuit parameters are chosen in such a way that $V_{AH}$ is greater than $V_{AL}$. That is, the two parts of the $V_{PS}$ range partially overlap. As a result, portions 20 and 22 are both conductive in the intermediate $V_{AL}$-to-$V_{AH}$ sub-range so that the differential amplifier attains rail-to-rail input capability.

Differential portion 20 is formed with like-configured input amplifiers A1 and A2 of a first polarity type. The first electrodes of amplifiers A1 and A2 are tied together at supply point P1 to receive operating current $I_{P1}$. Input voltages $V_{I1}$ and $V_{I2}$ are supplied to the control electrodes of amplifiers A1 and A2. Their second electrodes provide complementary intermediate currents $I_A$ and $I_B$ as the output signals of portion 20. When $V_{CM}$ is in the $V_{AL}$-to-$V_{HH}$ range, amplifiers A1 and A2 largely divide current $I_{P1}$ between currents $I_A$ and $I_B$ at values whose difference is representative of the differential input signal.

Differential portion 22 contains a voltage level-shift circuit 24 for translating the differential input signal into a shifted differential signal whose common-mode voltage exceeds $V_{CM}$ by a specified amount. The main part of level-shift circuit 24 consists of like-configured input amplifiers A3 and A4 of a second polarity type opposite to the first polarity type. Voltages $V_{I1}$ and $V_{I2}$ are provided to the control electrodes of amplifiers A3 and A4. Their second electrodes are connected to the $V_{LL}$ supply. Because amplifiers A3 and A4 are complementary to amplifiers A1 and A2, portion 22 performs signal amplification at the opposite end of the $V_{PS}$ range from portion 20.

The A3 and A4 first electrodes are coupled to nodes N1 and N2 at which the shifted differential signal is supplied. A voltage level shift occurs between the control and first electrodes of each of amplifiers A3 and A4. If this level shift is less than the total level shift needed, a level-shift element 26 is connected between node N1 and the A3 first electrode. A largely identical level-shift element 28 is similarly connected between node N2 and the A4 first electrode.

Level-shift current sources 16 and 18 are again connected to the $V_{HH}$ supply to provide supply currents $I_{H1}$ and $I_{H2}$ at nodes N1 and N2. Currents $I_{H1}$ and $I_{H2}$ are substantially equal. When amplifiers A3 and A4 are turned on so that level-shift circuit 24 is conductive, currents $I_{H1}$ and $I_{H2}$ flow through level shifts 26 and 28 and then through amplifiers A3 and A4 to the $V_{LL}$ supply.

A current-steering circuit provides alternate paths for currents $I_{H1}$ and $I_{H2}$ to flow to the $V_{LL}$ supply when $V_{CM}$ gets sufficiently close to $V_{HH}$ that amplifiers A3 and A4 turn off so as to make level-shift circuit 24 nonconductive. The action of the current-steering circuit prevents current sources 16 and 18 from going into an undesired condition, such as saturation or turn-off, when amplifiers A3 and A4 turn off. Consequently, current sources 16 and 18 remain in their (non-saturated) fully conductive state during the full traverse of $V_{CM}$ across the $V_{PS}$ range.

The current-steering action involves preventing the voltages at nodes N1 and N2 from rising to values that would otherwise cause current sources 16 and 18 to decay into an undesired condition when $V_{CM}$ gets close to $V_{HH}$. More particularly, the current-steering circuit prevents the difference $V_{C1}$ between the voltage at node N1 and a clamping reference voltage $V_{RC}$ from exceeding a specified value $V_{CMAX}$. The steering circuit also prevents the difference $V_{C2}$ between the voltage at node N2 and voltage $V_{RC}$ from exceeding $V_{CMAX}$.

Current source 16 would go into an undesirable condition (e.g., saturation) if the difference between the N1 voltage and $V_{HH}$ dropped down to or went below a minimum value $V_{MINH}$. Current source 18 would likewise be in an undesirable condition if the difference between the N2 voltage and $V_{HH}$ were less than or equal to $V_{MINH}$. As a result, $V_{CMAX}$ is slightly less than $V_{HH} - V_{MINH} - V_{RC}$. $V_{MINH}$ is typically 0.1–0.3 volt.

For the normal case in which the differential amplifier includes level shifts 26 and 28, the current-steering circuit is preferably implemented by utilizing clamps 30 and 32 as shown in FIG. 3. Clamp 30 is connected between the $V_{LL}$ supply and a node N3 lying in the path between level shift 26 and the A3 first electrode. Clamp 32 is similarly connected between the $V_{LL}$ supply and a node N4 lying in the path between level shift 28 and the A4 first electrode.

In the foregoing situation, clamps 30 and 32 operate directly only on the voltages at nodes N3 and N4. That is, clamp 30 prevents the difference between $V_{RC}$ and the N3 voltage from exceeding a given value, while clamp 32 prevents the difference between $V_{RC}$ and the N4 voltage from exceeding that value. The clamping on nodes N1 and N2 is achieved by way of level shifts 26 and 28 whose level shift is added to the clamping voltage of clamps 30 and 32. Level shifts 26 and 28 thereby form part of the current-steering circuit here. The advantage of this arrangement is that clamps 30 and 32 also prevent elements 26 and 28 from turning off when $V_{CM}$ gets too close to $V_{HH}$.

Alternatively, clamps 30 and 32 could be connected directly to nodes N1 and N2 as indicated in dotted line in FIG. 3. This alternative can be used regardless of whether level shifts 26 and 28 are absent or not. Of course, if elements 26 and 28 are present, the above-mentioned advantage is lost.

Clamps 30 and 32 are typically implemented in the manner shown in FIG. 3. The principal elements are like-configured clamping amplifiers AC1 and AC2 of the second polarity type. The first electrodes of amplifiers AC1 and AC2 are coupled to nodes N3 and N4. Reference voltage $V_{RC}$ is supplied to the control electrodes of amplifiers AC1 and AC2. Their second electrodes are tied to the $V_{LL}$ supply. Clamp 30 may include a resistor RC1 connected between node N3 and the AC1 first electrode. If so, clamp 32 includes a matching resistor RC2 connected between node N4 and the AC2 second electrode.

As the preceding discussion indicates, amplifiers AC1 and AC2 are of the same polarity as amplifiers A3 and A4. Because amplifiers AC1 and A3 are coupled together through node N3, amplifier AC1 turns on as amplifier A3 turns off and vice versa. Likewise, amplifier AC2 turns on as amplifier A4 turns off and vice versa due to the coupling through node N4.

An amplifier circuit 34 formed with like-configured amplifiers A5 and A6 performs the actual signal amplification in differential portion 22. The shifted differential signal at nodes N1 and N2 is supplied to the control electrodes of amplifiers A5 and A6. Their first electrodes are connected together at supply point P2 to receive operating current $I_{P2}$. The A5 and A6 second electrodes supply complementary intermediate currents $I_C$ and $I_D$ as the output signals of portion 22. When $V_{CM}$ is in the $V_{LL}$-to-$V_{AH}$ range, amplifiers A5 and A6 largely divide current $I_{P2}$ between currents $I_C$ and $I_D$ at values whose difference is representative of the voltage difference between nodes N1 and N2 and is therefore representative of the differential input signal.

The A1 and A5 second electrodes are both connected to output terminal $T_{O1}$ so as to provide it with output current $I_{O1}$ at a value equal to $I_A + I_C$. The A2 and A6 second electrodes are likewise both connected to output terminal $T_{O2}$ in order to provide it with complementary output current $I_{O2}$ at a value equal to $I_B + I_D$. A low-resistance load 36, tied to the $V_{HH}$ supply, preferably converts currents $I_{O1}$ and $I_{O2}$ into complementary output voltages $V_{O1}$ and $V_{O2}$. Alternatively, a summing circuit 38 could subtract one of currents $I_{O1}$ and $I_{O2}$ from the other to produce a composite output current $I_O$ representative of the difference between $I_{O1}$ and $I_{O2}$.

A control amplifier AN of the first polarity type controls the values at which currents $I_{P1}$ and $I_{P2}$ are supplied to differential portions 20 and 22. Control amplifier AN has its first and second electrodes respectively connected to points P1 and P2. Control voltage $V_{RN}$ is provided to the AN control electrode at a value sufficient to enable both of portions 20 and 22 to be operationally conductive in the intermediate $V_{AL}$-to-$V_{AH}$ sub-range. $V_{RN}$ is typically near the middle of the $V_{AL}$-to-$V_{AH}$ sub-range. The current control provided by amplifier AN allows the circuit transconductance to be regulated in a desired manner.

The present differential amplifier operates in a manner similar to that of the prior art circuit described above, except that current sources 16 and 18 do not go into an undesirable condition when $V_{CM}$ gets close to $V_{HH}$. More specifically, the operation proceeds as follows when $V_{CM}$ is raised from low rail $V_{LL}$ to high rail $V_{HH}$.

As $V_{CM}$ rises from $V_{LL}$ to $V_{AL}$. amplifier AN is fully conductive and steers all of current $I_L$ to differential portion 22. $I_{P2}$ equals $I_L$. Amplifiers A3–A6 are all fully turned on. Portion 22 is in a state of full operational conductivity. $I_{P1}$ is zero. Amplifiers A1 and A2 are turned off so that differential portion 20 is non-conductive. The steering circuit formed with clamps 30 and 32 is inactive. In the particular embodiment shown in FIG. 3, amplifiers AC1 and AC2 are turned off.

When $V_{CM}$ goes from $V_{AL}$ (past $V_{RN}$) up to $V_{AH}$, amplifier AN turns progressively off so as to progressively divert more of the main supply current away from portion 22 and toward portion 20. $I_{P1}$ increases progressively to $I_L$. Amplifiers A1 and A2 turn progressively on as portion 20 goes from its non-conductive state to a state of full operational conductivity. Conversely, $I_{P2}$ drops progressively to zero. Amplifiers A5 and A6 turn progressively off, causing portion 22 to go from its fully conductive state to a non-conductive state.

As $V_{CM}$ rises from $V_{AH}$ to $V_{HH}$, amplifier AN is turned fully off. All of the main supply current is now steered to portion 20. $I_{P1}$ equals $I_L$. Amplifiers A1 and A2 are turned fully on. Portion 20 is in its fully conductive state. $I_{P2}$ equals zero. Amplifiers A5 and A6 are both turned off so that portion 22 is non-conductive.

When $V_{CM}$ gets sufficiently close to $V_{HH}$, amplifiers A3 and A4 turn off. As this happens, the current-steering circuit of the invention becomes active to ensure that current sources 16 and 18 remain in their fully conductive (non-saturated) state. Currents $I_{H1}$ and $I_{H2}$ are steered through the steering circuit to the $V_{LL}$ supply.

For the embodiment of clamps 30 and 32 depicted in FIG. 3, amplifiers AC1 and AC2 turn on as amplifiers A3 and A4 turn off. This occurs when $V_{CM}$ is in the vicinity of, and typically slightly higher than, $V_{RC}$. Alternative paths are thereby opened through resistors RC1 and RC2 (if present) and through amplifiers AC1 and AC2 for supply currents $I_{H1}$ and $I_{H2}$ to flow to the $V_{LL}$ supply.

Let $I_H$ represent the steady-state value of each of currents $I_{H1}$ and $I_{H2}$, while $R_C$ represents the value of each of resistors RC1 and RC2. The voltages across resistors RC1 and RC2 are then equal to $I_H R_C$ when amplifiers AC1 and AC2 are fully conductive. Let $V_{LSE}$ be the extra level-shift voltage supplied by level-shift elements 26 and 28. The voltages from the control electrodes of amplifiers AC1 and AC2 to their respective first electrodes reach approximately the same value, referred to here as $V_{LSC}$. As a result, the N1 and N2 voltages are clamped at a value equal to $V_{RC} + V_{CMAX}$, where $V_{CMAX}$ equals $V_{LSE} + I_H R_C + V_{LSC}$.

If clamps 30 and 32 were to clamp the N1 and N2 voltages at the preceding value before amplifier AN reduced current $I_{P2}$ to zero, the amplification provided by amplifiers A5 and A6 in circuit 34 would be cut off prematurely, resulting in loss of transconductance. This problem is avoided by choosing the value of voltage $V_{RC}$ and the characteristics of amplifiers AC1, AC2, A3, and A4 and resistors RC1 and RC2 in such a way that amplifiers AC1 and AC2 do not start to turn on until $I_{P2}$ has indeed dropped substantially to zero. In particular, $V_{RC}$ is normally chosen to be greater than or equal to $V_{RN}$.

The value of $V_{CM}$ at which amplifiers AC1 and AC2 start to become conductive must be greater than $V_{AH}$. The way in which amplifier AN is differentially connected to amplifiers A1 and A2 is similar to the way in which amplifiers AC1 and AC2 are differentially connected to amplifiers A3 and A4, except for the presence of resistors RC1 and RC2. If amplifier AN switches from a fully conductive condition to a non-conductive condition in a voltage space approximately equal to $V_{AH} - V_{AL}$, and if $V_{RC}$ is as low as $V_{RN}$, the parameter $I_H R_C$ should be approximately equal to $V_{AH} - V_{AL}$. This ensures that amplifiers AC1 and AC2 switch from a non-conductive state to a fully conductive state at a $V_{CM}$ value sufficiently higher than $V_{AH}$ as to avoid prematurely cutting off amplifiers A5 and A6. However, $I_H R_C$ could be lower if $V_{RC}$ is greater than $V_{RN}$. For example, $I_H R_C$ could be zero if $V_{RC} - V_{RN}$ equals $V_{AH} - V_{AL}$.

When nodes N1 and N2 are clamped, the voltage across each of current sources 16 and 18 equals $V_{HH} - V_{LSE} - I_H R_C - V_{LSC} - V_{RC}$. Consequently, $V_{RC}$ is less than $V_{HH} - V_{MINH} - V_{LSE} - I_H R_C - V_{LSC}$.

Looking now at the level-shifts requirements, let $V_{LSI}$ represent the level shift that amplifiers A3 and A4 provide from their control electrodes to their respective first electrodes. The total level shift $V_{LSTOT}$ provided by level-shift circuit 24 at nodes N1 and N2 then equals $V_{LSI} + V_{LSE}$.

Amplifiers A5 and A6 are turned on when $V_{CM}$ is at $V_{LL}$. Since amplifier AN is also turned on, $V_{LSTOT}$ must be greater than or equal to $V_{MINL} + V_{MINN} + V_{LSO}$, where $V_{MINL}$ is the minimum tolerable voltage across current source 6 (i.e., between point P1 and the $V_{LL}$ point), $V_{MINN}$ is the minimum tolerable voltage across amplifier AN (i.e., between points P1 and P2), and $V_{LSO}$ is the voltage that amplifiers A5 and A6 provide from their control electrodes to their respective first electrodes. $V_{MINL}$ and $V_{MINN}$ each are typically 0.1–0.3 volt. If $V_{LSO}$ is approximately equal to $V_{LSI}$, it turns out that level shift $V_{LSE}$ provided by elements 26 and 28 need only be greater than $V_{MINL} + V_{MINN}$.

Turning to voltage $V_{RN}$, it must exceed $V_{LL} + V_{MINL} + V_{LSN}$, where $V_{LSN}$ is the voltage between the control and first electrodes of amplifier AN when it is fully conductive. $V_{RN}$ is also less than $V_{HH} - V_{MINH} - V_{LSE} - V_{LSI}$. The transmission delay through portion 22 is somewhat longer than that through portion 20. Accordingly, it is desirable that portion 20 provide as much of the signal amplification across the $V_{PS}$ range as possible. For this reason, $V_{RN}$ is normally set at a value near the lower limit.

Figure 1:
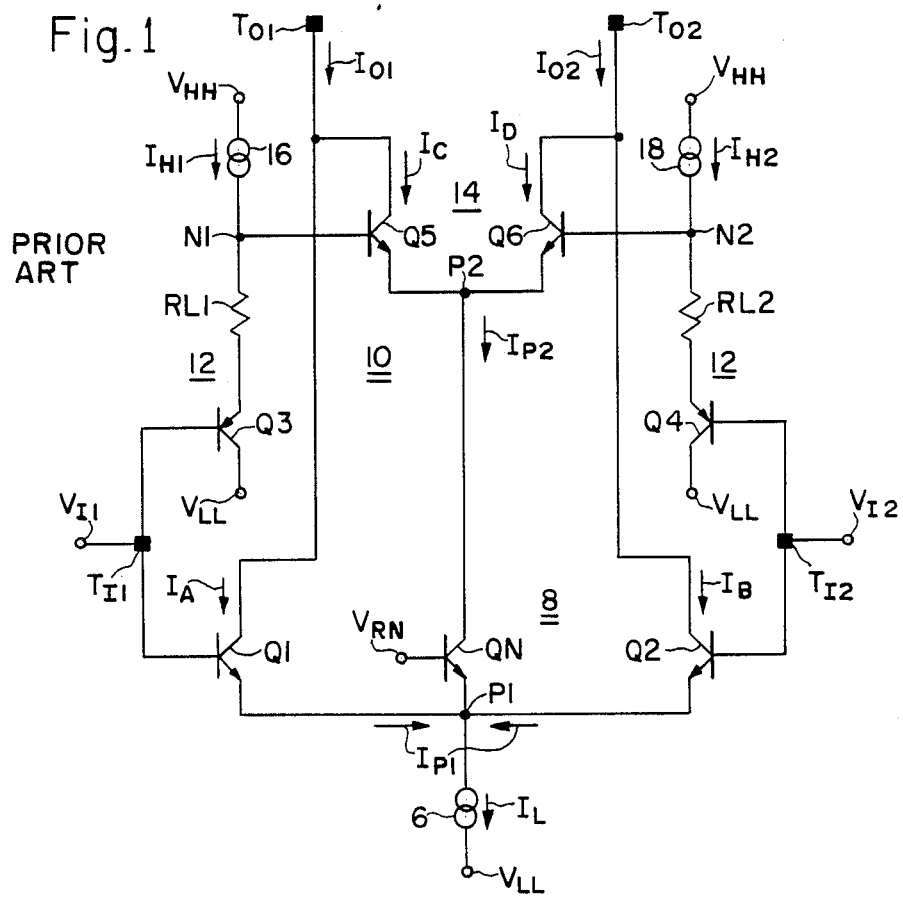
FIG. 1 is a circuit diagram of a prior art differential amplifier.
Figure 2:
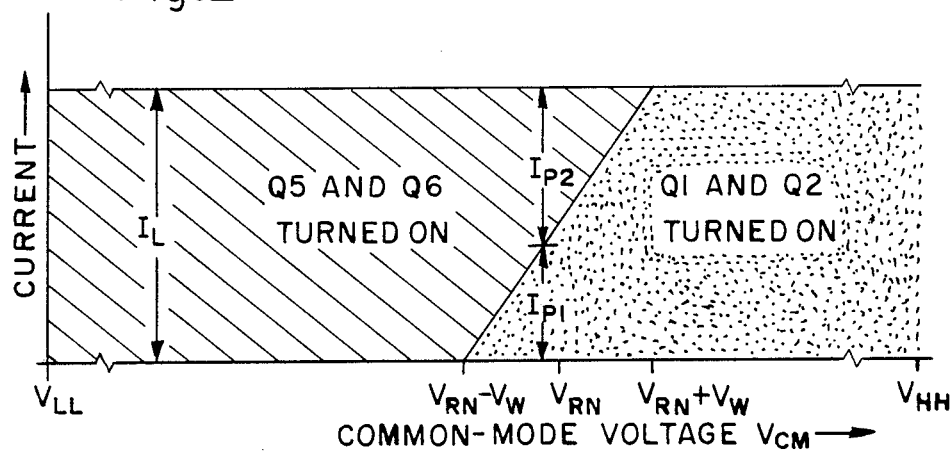
FIG. 2 is a graph illustrating operational characteristics of the differential amplifiers in FIGS. 1 and 4.
Figure 4:
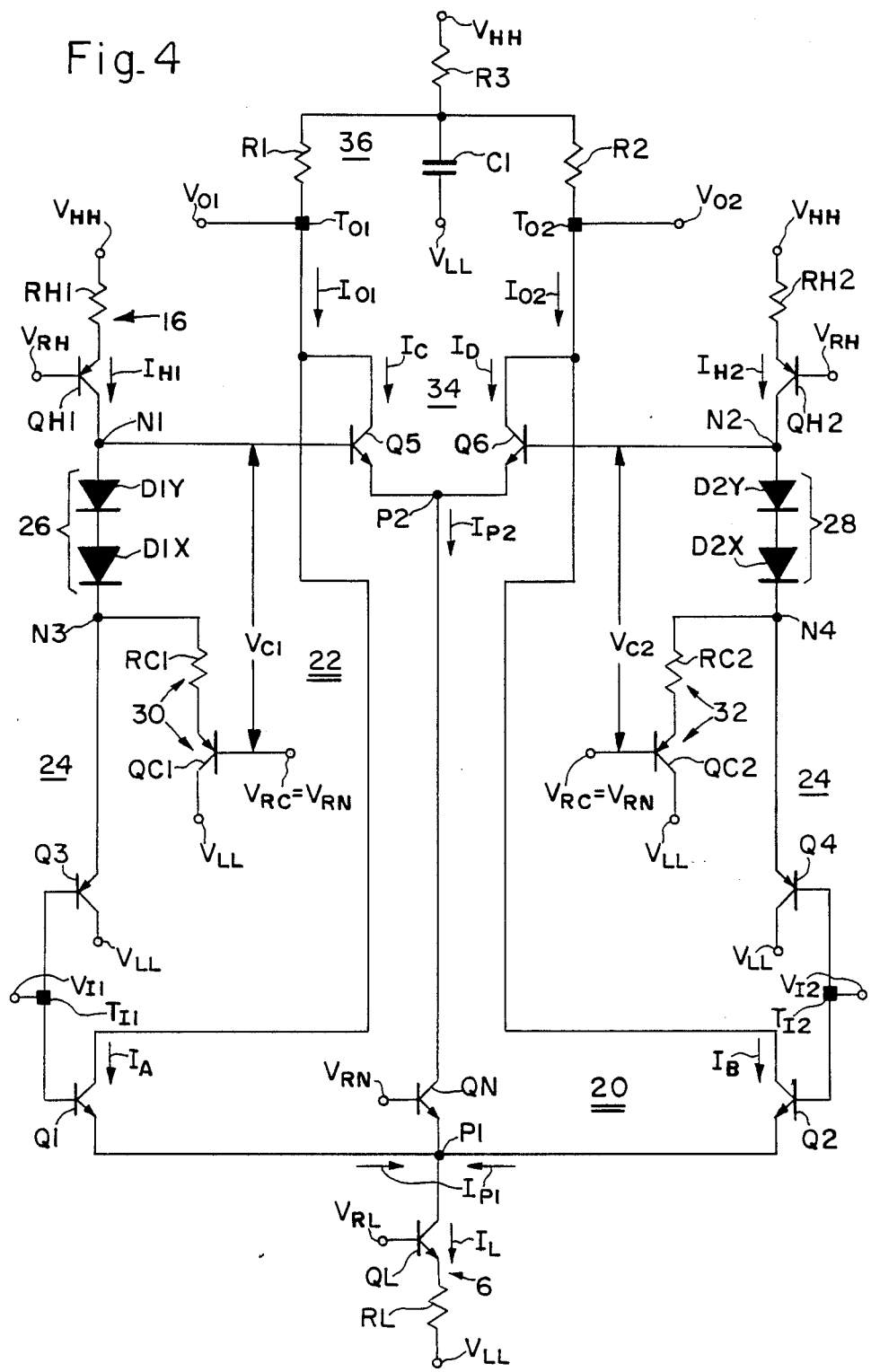
FIG. 4 is a circuit diagram of a bipolar embodiment of the differential amplifier in FIG. 3.

FIG. 4 depicts a preferred bipolar embodiment of the preceding device in which amplifiers A1–A6 and AN consist of transistors Q1–Q6 and QN configured as shown in FIG. 1 and operable in the manner described above. Since $V_{LSN}$ and $V_{LSI}$ both equal $1 V_{BE}$, $V_{RN}$ lies in the range from $V_{LL} + V_{MINL} + V_{BE}$ to $V_{HH} - V_{MINH} - V_{BE} - V_{LSE}$. This corresponds generally to the range given above for the prior art circuit of FIG. 1. Consequently, the transconductance of the differential amplifier in FIG. 4 is substantially constant.

In FIG. 4, current source 6 is formed in a conventional way with a resistor RL and an NPN transistor QL responsive to a reference voltage $V_{RL}$. Current source 16 consists of a PNP transistor QH1 and a resistor RH1 arranged in a conventional manner. Current source 18 likewise consists of a PNP transistor QH2 and a resistor RH2 arranged in the same way. Transistors QH1 and QH2 both respond to the same reference voltage $V_{RH}$.

Level shift 26 consists of PN diodes D1X and D1Y connected in series. Level shift 28 similarly consists of PN diodes D2X and D2Y connected in series. As a result, $V_{LSE}$ equals $2V_{BE}$. Each of diodes D1X, D1Y, D2X, and D2Y is preferably form as an NPN transistor having its collector connected back to its base in order to minimize transmission delay caused by base resistance and base charge storage effects.

In FIG. 4, the current-steering circuit of the invention utilizes clamps 30 and 32 connected directly to nodes N3 and N4. In addition to preventing diodes D1X, D1Y, D2X, and D2Y from turning off when transistors Q3 and Q4 turn off, this arrangement avoid undesired temperature dependencies within the circuit.

Amplifiers AC1 and AC2 in clamps 30 and 32 of FIG. 3 are implemented with PNP transistors QC1 and QC2 in FIG. 4. $V_{RC}$ equals $V_{RN}$ here. Clamps 30 and 32 also include resistors RC1 and RC2 in this bipolar embodiment. By inspection, $V_{CMAX}$ equals $3V_{BE} + I_H R_C$. The voltage drop $I_H R_C$ across each of resistors RC1 and RC2 when nodes N1 and N2 are clamped is at least 120 millivolts and is typically 200 millivolts. This is sufficient to avoid the previously mentioned amplification notches that would otherwise result from premature turn-off of transistors Q5 and Q6.

The embodiment in FIG. 4 employs load 36 to produce complementary output voltages $V_{O1}$ and $V_{O2}$. Load 36 consists of resistors R1-R3 and a capacitor C1 arranged as shown. Capacitor C1 prevents spurious common-mode signals from appearing on the $V_{HH}$ supply line. Alternatively, elements C1 and R3 could be deleted.

In the preferred embodiment, $V_{HH}$ and $V_{LL}$ are 5.0 and 0.0 volts, respectively. $V_{RN}/V_{RC}$, $V_{RL}$, and $V_{RH}$ are 1.25, 0.9, and 4.1 volts, respectively. $I_L$ and $I_{H1}/I_{H2}$ are 380 and 200 micro-amperes, respectively. RH1/RH2, RC1/RC2, R1/R2, and R3 are 500, 1,250, 750, and 100 ohms, respectively. C1 is 15 picofarads. The differential amplifier is fabricated as part of a monolithic integrated circuit using oxide isolation to separate active regions in a semiconductive wafer.

While the invention has been described with reference to particular embodiments, this description is solely for the purpose of illustration and is not to be construed as limiting the scope of the invention claimed below. For example, semiconductor elements of opposite polarity to those described above might be used to accomplish the same results. FETs could replace some or all of the bipolar transistors. An input level-shift circuit of the type described in U.S. patent application Ser. No. 309,469, filed Feb. 10, 1989, could be inserted in front of differential portions 20 and 22 to enable the differential amplifier to operate at a power supply voltage of 1 volt or slightly less. Persons skilled in the art may thus make various modifications and applications without departing from the true scope and spirit of the invention as defined in the appended claims.

I claim:

1. An electronic circuit, coupled between sources of first and second supply voltages whose difference is a power supply voltage that defines a supply voltage range, for amplifying an input signal differentially provided between a pair of input terminals, the circuit comprising:

first differential means coupled to the input terminals for amplifying the input signal by largely dividing a first operating current provided at a first supply point into a pair of first intermediate currents whose difference is representative of the input signal when its common-mode voltage $V_{CM}$ is in a part of second differential means comprising (a) level-shift means coupled to the input terminals for differentially supplying a pair of nodes with a shifted signal whose common-mode voltage is closer to the second supply voltage than is $V_{CM}$, (b) a level-shift current supply coupled between the source of the second supply voltage and one of the nodes, (c) a level-shift current supply coupled between the source of the second supply voltage and the other node, and (d) amplifier means coupled to the nodes for amplifying the input signal by largely dividing a second operating current provided at a second supply point into a pair of second intermediate currents whose difference is representative of the input signal when $V_{CM}$ is in a part of the supply range extending to the first supply voltage, the two parts of the supply range partially overlapping;

a main current supply coupled between the first supply point and the source of the first supply voltage; and a control amplifier having a first flow electrode coupled to the first supply point, a second flow electrode coupled to the second supply point, and a control electrode responsive to a control voltage for regulating current flow between the flow electrodes; characterized by current-steering means for enabling the level-shift current supplies to remain operationally conductive as $V_{CM}$ traverses substantially the entire supply range.

2. A circuit as in claim 1 characterized in that the current-steering means establishes paths by which current from the level-shift current supplies flows to the source of the first supply voltage as the level-shift means turns off.

3. A circuit as in claim 2 characterized in that the current-steering means prevents the difference between the voltage at each node and a clamping reference voltage from exceeding a specified clamping value.

4. A circuit as in claim 3 characterized in that the current-steering means comprises (a) a voltage clamp coupled between one of the nodes and the source of the first supply voltage and (b) a voltage clamp coupled between the other node and the source of the first supply voltage.

5. An electronic circuit, coupled between sources of a first supply voltage and a second supply voltage whose difference is a power supply voltage that defines a supply voltage range, for amplifying an input signal differentially provided between first and second input terminals, the circuit comprising:

first differential means for amplifying the input signal when its common-mode voltage $V_{CM}$ is in a part of the supply range extending to the second supply voltage, the first differential means comprising like-configured first and second input amplifiers of a first polarity type, the first and second amplifiers having respective control electrodes coupled respectively to the first and second input terminals, respective first flow electrodes coupled to a first supply Point, and respective second flow electrodes coupled respectively to first and second output terminals;

second differential means for amplifying the input signal when $V_{CM}$ is in a part of the supply range extending to the first supply voltage, the two parts of the supply range partially overlapping, the second differential means comprising (a) like configured third and fourth input amplifiers of a second polarity type opposite to the first polarity type, the third and fourth input amplifiers having respective control electrodes coupled respectively to the first and second input terminals, respective first flow electrodes coupled respectively to first and second nodes, and respective second flow electrodes coupled to the source of the first supply voltage, (b) a first current supply coupled between the first node and the source of the second supply voltage, (c) a second current supply coupled between the second node and the source of the second supply voltage, and (d) like-configured fifth and sixth amplifiers of the first polarity type, the fifth and sixth amplifiers having respective control electrodes coupled respectively to the first and second nodes, respective first flow electrodes coupled to a second supply point, and respective second flow electrodes coupled respectively to the first and second output terminals;

a main current supply coupled between the first supply point and the source of the first supply voltage; and a control amplifier of the first polarity type, the control amplifier having a control electrode for receiving a control voltage, a first flow electrode coupled to the first supply point, and a second flow electrode coupled to the second supply point; characterized by current-steering means for enabling the first and second current supplies to remain operationally conductive as $V_{CM}$ traverses substantially the entire supply range.

6. A circuit as in claim 5 characterized in that the current-steering means establishes paths by which current from the first and second current supplies flows to the source of the first supply voltage as the third and fourth amplifiers turn off.

7. A circuit as in claim 6 characterized in that the current-steering means prevents (a) the difference between the voltage at the first node and a clamping reference voltage from exceeding a specified clamping value and (b) the difference between the voltage at the second node and the reference voltage from exceeding the specified clamping value.

8. A circuit as in claim 7 characterized in that the current-steering means comprises (a) a first voltage clamp coupled between the first node and the source of the first supply voltage and (b) a second voltage clamp coupled between the second node and the source of the first supply voltage.

9. A circuit as in claim 8 characterized in that the first and second voltage clamps respectively comprise first and second clamping amplifiers of the second polarity type, the first and second clamping amplifiers having respective control electrodes for receiving the reference voltage, respective first flow electrodes coupled respectively to the first and second nodes, and respective second electrodes coupled to the source of the first supply voltage.

10. A circuit as in claim 8 in which charge carriers that move between the flow electrodes of each amplifier originate at its first electrode and terminate at its second electrode under control of its control electrode.

11. A circuit as in claim 7 in which the second differential means includes (a) a first voltage level-shift element coupled in the path between the first node and the first electrode of the third amplifier and (b) a second voltage level-shift element coupled in the path between the second node and the first electrode of the fourth amplifier.

12. A circuit as in claim 11 characterized in that the current-steering means comprises (a) a first voltage clamp coupled between the source of the first supply voltage and a third node located in the path between the first level-shift element and the first electrode of the third amplifier and (b) a second voltage clamp coupled between the source of the first supply voltage and a fourth node located in the path between the second level-shift element and the first electrode of the fourth amplifier.

13. A circuit as in claim 12 characterized in that the first and second voltage clamps respectively comprise first and second clamping amplifiers of the second polarity type, the first and second clamping amplifiers having respective control electrodes for receiving the reference voltage, respective first flow electrodes coupled respectively to the third and fourth nodes, and respective second electrodes coupled to the source of the first supply voltage.

14. A circuit as in claim 13 characterized in that each amplifier comprises a bipolar transistor having a base, an emitter, and a collector respectively coupled to the control, first, and second electrodes of that amplifier.

15. A circuit as in claim 14 characterized in that (a) the first clamp further includes a first clamping resistor coupled between the third node and the emitter of the transistor in the first clamping amplifier and (b) the second clamp further includes a second clamping resistor coupled between the fourth node and the emitter of the transistor in the second clamping amplifier.

16. A circuit as in claim 15 characterized in that each level-shift element comprises at least one diode.

17. A circuit as in claim 16 characterized in that the the transistors in the first and second clamping amplifiers and in the third and fourth input amplifiers are PNP transistors, the remaining transistors all being NPN transistors.

18. A circuit as in claim 15 characterized in that the reference voltage is substantially equal to the control voltage.

* * * * *

UNITED STATES PATENT AND TRADEMARK OFFICE
CERTIFICATE OF CORRECTION

PATENT NO. : 4,977,378

DATED : 11 December 1990

INVENTOR(S) : John Philip Tero

It is certified that error appears in the above-identified patent and that said Letters Patent is hereby corrected as shown below:

Col. 3, lines 39 and 40, "first-supply" should read -- first supply -- .

Col. 4, line 17, "there by" should read -- thereby --.

Col. 10, line 9, "form" should read -- formed --.

Claim 1, line 13, after "part of", insert -- the supply range extending to the second supply voltage; --;

line 27, begin a new subparagraph with "a control amplifier...".

Claim 5, line 16, "Point" should read -- point --.

Signed and Sealed this

Twenty-eighth Day of April, 1992

Attest:

HARRY F. MANBECK, JR.

*Attesting Officer*     *Commissioner of Patents and Trademarks*